United States Patent
Chiu et al.

(10) Patent No.: US 10,096,569 B2
(45) Date of Patent: Oct. 9, 2018

(54) SEMICONDUCTOR DEVICE AND METHOD FOR MANUFACTURING THE SAME

(71) Applicants: ADVANCED SEMICONDUCTOR ENGINEERING, INC., Kaohsiung (TW); NATIONAL CHUNG HSING UNIVERSITY, Taichung (TW)

(72) Inventors: Ying-Ta Chiu, Kaohsiung (TW); Shang-Kun Huang, Kaohsiung (TW); Yong-Da Chiu, Kaohsiung (TW); Jenn-Ming Song, Taichung (TW)

(73) Assignees: ADVANCED SEMICONDUCTOR ENGINEERING, INC., Kaohsiung (TW); NATIONAL CHUNG HSING UNIVERSITY, Taichung (TW)

( * ) Notice: Subject to any disclaimer, the term of this patent is extended or adjusted under 35 U.S.C. 154(b) by 0 days.

(21) Appl. No.: 15/444,130

(22) Filed: Feb. 27, 2017

(65) Prior Publication Data
US 2018/0247913 A1    Aug. 30, 2018

(51) Int. Cl.
    *H01L 23/00* (2006.01)
(52) U.S. Cl.
    CPC .............. *H01L 24/80* (2013.01); *H01L 24/05* (2013.01); *H01L 2224/80009* (2013.01); *H01L 2224/8012* (2013.01); *H01L 2224/80092* (2013.01); *H01L 2224/80203* (2013.01)
(58) Field of Classification Search
    CPC combination set(s) only.
    See application file for complete search history.

(56) References Cited

U.S. PATENT DOCUMENTS

| | | | |
|---|---|---|---|
| 6,620,282 B2 | 9/2003 | Mori et al. | |
| 2010/0233874 A1* | 9/2010 | Ito | H01L 21/76823 438/600 |
| 2013/0252022 A1* | 9/2013 | Bullard | B32B 15/011 428/685 |
| 2015/0167131 A1* | 6/2015 | Bullard | C22C 38/18 428/610 |

OTHER PUBLICATIONS

Bersch et al., "Cu—Cu Direct Bonding for Ultra-High Density Chip-To-Chip Interconnects," Chip Scale Review, Jul./Aug. 2013, vol. 17, No. 4, pp. 20-25.
SET, "SET's latest developments in Removal of Oxide", http://www.set-sas.fr/en/mpg11-428341--SET-s-latest-developments-in-Removal-of-Oxide.html, 4 pages, downloaded Feb. 24, 2017.

* cited by examiner

*Primary Examiner* — Mamadou Diallo
(74) *Attorney, Agent, or Firm* — Foley & Lardner LLP; Cliff Z. Liu

(57) ABSTRACT

The present disclosure relates to a method for manufacturing a semiconductor device. The method includes providing a first electronic component including a first metal contact and a second electronic component including a second metal contact, changing a lattice of the first metal contact, and bonding the first metal contact to the second metal contact under a predetermined pressure and a predetermined temperature.

19 Claims, 3 Drawing Sheets

SEMICONDUCTOR DEVICE AND METHOD FOR MANUFACTURING THE SAME

BACKGROUND

1. Technical Field

The present disclosure relates to a semiconductor device and a method for manufacturing the same, and more particularly to a semiconductor device including a solid bonding structure and a solid bonding method for bonding a metal to a metal, a metal to a ceramic, or for bonding other solid materials.

2. Description of the Related Art

A thermo-compression bonding technique allows a metal to be directly bonded to another metal without using a tin (Sn) solder. However, this technique is usually carried out under a high working temperature (e.g., greater than 400 degrees Celsius (° C.)) and a high pressure (e.g., greater than 10 megapascal (MPa)), which increases manufacturing cost and damages circuits to be bonded. Therefore, it is desirable to develop a thermo-compression bonding technique which can be carried out under a relatively low temperature and pressure.

SUMMARY

In some embodiments, a method for manufacturing a semiconductor device includes providing a first electronic component including a first metal contact and a second electronic component including a second metal contact, changing a lattice of the first metal contact, and bonding the first metal contact to the second metal contact under a predetermined pressure and a predetermined temperature.

In some embodiments, a method for manufacturing a semiconductor device includes: providing a first electronic component including a first metal contact and a second electronic component including a second metal contact, the first metal contact having a first surface and the second metal contact having a second surface; roughening the first surface of the first metal contact by distorting a lattice at the first surface of the first metal contact; and bonding the first surface of the first metal contact to the second surface of the second metal contact.

Figure 1:
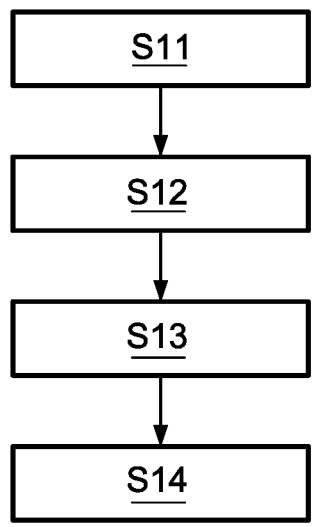
FIG. 1 illustrates a method of manufacturing a semiconductor device in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

FIG. 1 illustrates a method for directly bonding one electronic component (e.g., a first electronic component) to another electronic component (e.g., a second electronic component) without using a bonding agent (such as solder or indium).

Referring to operation S11, a first electronic component including a first metal contact and a second electronic component including a second metal contact are provided. In some embodiments, the first electronic component is an integrated circuit (IC) chip, a wafer (e.g., a die on a wafer), an interposer, a substrate, a resistor, a capacitor, an inductor or a combination thereof. In some embodiments, the second electronic component is the same as the first electronic component. Alternatively, the second electronic component and the first electronic component are different. In some embodiments, the first metal contact and the second metal contact are formed of, or include, metals, such as, but not limited to, copper, aluminum, silver, gold or any other suitable metal for bonding.

Referring to operation S12, an electromagnetic radiation irradiates on the first metal contact of the first electronic component to heat the first metal contact. In some embodiments, the electromagnetic radiation is infrared (IR) or ultraviolet (UV). In some embodiments, a wavelength of the electromagnetic radiation is in a range from about 200 nanometers (nm) to about 3000 nm, such as from about 700 nm to about 1100 nm or such as from about 200 nm to about 400 nm. In some embodiments, the first metal contact is irradiated by the electromagnetic radiation for a predetermined time, such as about 15 seconds or less, about 10 seconds or about 5 seconds or less, or from about 5 seconds to about 10 seconds. In some embodiments, a total power of the electromagnetic radiation is about 1000 watts (W). In some embodiments, the electromagnetic radiation irradiates on a portion of the first metal contact or on the entire first metal contact.

Figure 2A:
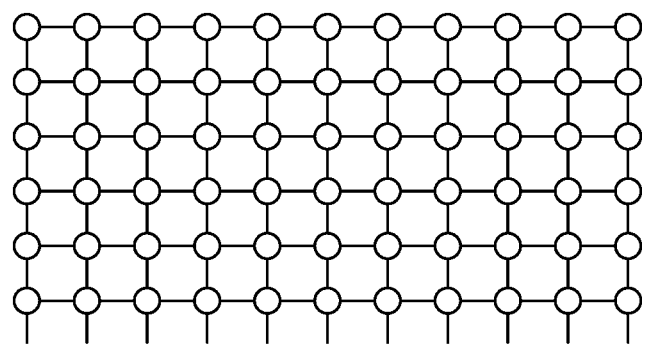
FIG. 2A, FIG. 2B and FIG. 2C illustrate schematic views of a lattice in accordance with some embodiments of the present disclosure.
Figure 2B:
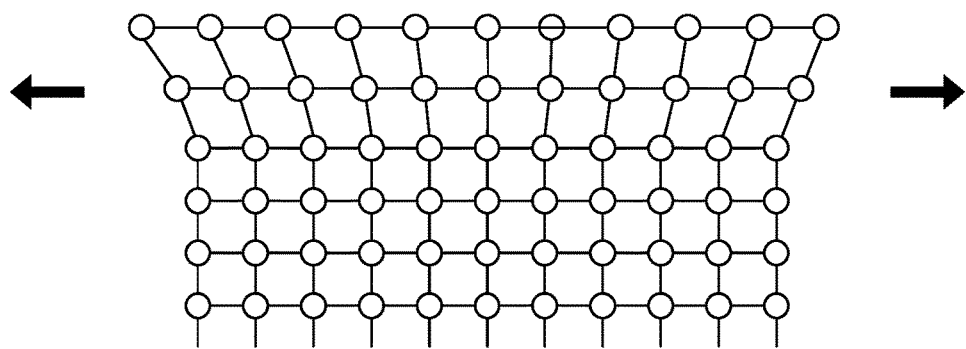
Figure 2C:
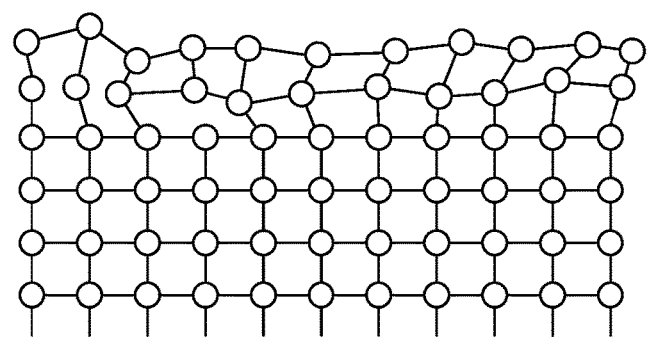

FIG. 2A shows a structure of a lattice of the first metal contact that is not irradiated by the electromagnetic radiation. FIG. 2B shows a structure of the lattice of the first metal contact after being irradiated by the electromagnetic radiation for a predetermined amount of time. FIG. 2C shows a structure of the lattice of the first metal contact after cooling. In some embodiments, after being irradiated by the electromagnetic radiation for a predetermined amount of time, the lattice of the first metal contact of the first electronic component expands, and then the lattice of the first metal contact is distorted after cooling. By irradiating the first metal contact, a roughness, hardness, modulus and shear strength of the first metal contact all increase. For example, the roughness (e.g., root-mean-square surface roughness) of the irradiated first metal contact may be in a range from about 4 nm to about 6 nm, which is about 2.2 to about 2.8 times greater than the roughness of the un-irradiated first metal contact. The hardness of the irradiated first metal contact may be in a range from about 5.5 gigapascal (GPa) to about 6.5 GPa, which is about 2 to about 2.2 times greater than the hardness of the un-irradiated first metal contact. The modulus of the irradiated first metal contact may be in a range from about 140 GPa to about 210 GPa, which is about 1.1 to about 1.5 times greater than the modulus of the un-irradiated first metal contact. The shear strength of the irradiated first metal contact may be in a range from about 45 MPa to about 50 MPa, which is about 1.18 to about 1.23 times greater than the shear strength of the un-irradiated first metal contact. Therefore, by irradiating the first metal contact, the lattice of the first metal contact is distorted to generate more defects of the lattice of the first metal contact, which would increase the bonding strength between the first metal contact and another metal contact to be bonded (such as the second metal contact).

Referring to FIG. 1, after the operation S12, metal oxide (e.g., copper oxide (CuO)) may be formed on the surface of the first metal contact. Therefore, in operation S13, a de-oxidation process is carried out to eliminate or remove the metal oxide on the surface of the irradiated first metal contact. In some embodiments, the de-oxidation process is carried out by dipping or cleaning the irradiated first metal contact with Acetone, Methyl alcohol, Citric acid and deionized (D.I.) water.

In operation S14, a bonding process is carried out to directly bond the first metal contact of the first electronic component to the second metal contact of the second electronic component. In some embodiments, the first metal contact and the second metal contact are aligned and then the first metal contact and the second metal contact are thermo-compressed under a predetermined condition. In some embodiments, the predetermined condition includes a temperature of less than about 400° C. or less than about 300° C., such as about 250° C., an operation time of about 20 minutes and a pressure of about 10 MPa.

The thermo-compression bonding technique can be applied to bond two metals (such as copper to copper or copper to aluminum) or two dissimilar solids (such as a metal and a ceramic or a metal and a glass) without using a bonding agent (such as solder or indium). In some embodiments, copper bumps or pads (such as the first metal contact and the second metal contact) from one electronic component (such as the first electronic component) are connected directly to another electronic component (such as the second electronic component) by thermo-compression bonding. In comparison, to achieve thermo-compression bonding, high working temperature (e.g., greater than 400° C.) and pressure (e.g., greater than 10 MPa) are used. However, a high working temperature may increase the manufacturing cost and may damage the circuits to be bonded. As the method shows in FIG. 1, in some embodiments, by irradiating the first metal contact to distort the lattice of the first metal contact and to generate more defects of the lattice of the first metal contact, the bonding strength between the first metal contact and the second metal contact may increase, and thus the bonding process can be carried out at a relatively lower temperature (e.g., 250° C.). Therefore, the method shown in FIG. 1 may reduce the manufacturing cost and may prevent the electronic components that are to be bonded from damage due to the high temperature. In some embodiments, both of the first metal contact of the first electronic component and the second metal contact of the second electronic component can be irradiated by the electromagnetic radiation in the operations as shown in FIG. 1, which may further increase the bonding strength therebetween.

Figure 3:
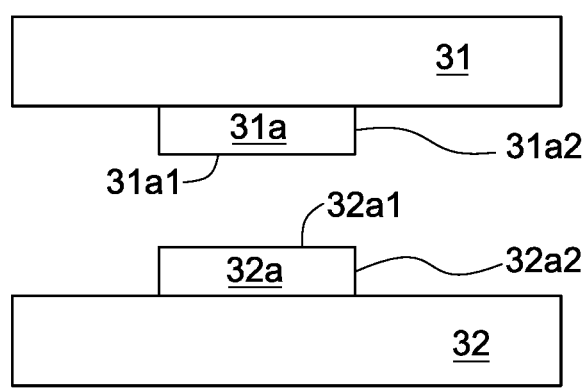
FIG. 3 illustrates a semiconductor device in accordance with some embodiments of the present disclosure.

FIG. 3 is a schematic view of a semiconductor device 3 in accordance with some embodiments of the present disclosure. Referring to FIG. 3, the semiconductor device 3 includes a first electronic component 31 including a first metal contact 31a that underwent irradiation during the operations shown in FIG. 1 and a second electronic component 32 including a second metal contact 32a that did not undergo the irradiation. In some embodiments, the first electronic component 31 and the second electronic component 32 may be an IC chip, a wafer (e.g., a die on a wafer), an interposer, a substrate, a resistor, a capacitor, an inductor or a combination thereof. In some embodiments, the second electronic component 32 is the same as the first electronic component 31. Alternatively, the second electronic component 32 and the first electronic component 31 are different. In some embodiments, the first metal contact 31a and the second metal contact 32a can be formed of, or can include, metals, such as, but not limited to, copper, aluminum, silver, gold or any other suitable metal for bonding.

After operation S12 shown in FIG. 1, a lattice of the surface 31a1 of the first metal contact 31a is changed (e.g., by distortion or expansion), and thus the lattice of the surface 31a1 of the first metal contact 31a is different from a lattice of the surface 32a1 of the second metal contact 32a in roughness, hardness, modulus and shear strength. For example, the roughness, hardness, modulus and shear strength of the surface 31a1 of the first metal contact 31a may all be greater than those of the surface 32a1 of the second metal contact 32a. In some embodiments, a lattice of the sidewall 31a2 of the first metal contact 31a may also be changed. For example, a roughness, hardness, modulus and shear strength of the sidewall 31a2 of the first metal contact 31a may all be greater than those of a sidewall 32a2 of the second metal contact 32a.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation about 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing a semiconductor device, comprising:
    providing a first electronic component including a first metal contact and a second electronic component including a second metal contact;
    irradiating an electromagnetic radiation on the first metal contact to change a lattice of the first metal contact; and
    bonding the first metal contact to the second metal contact under a pressure and a temperature.

2. The method of claim 1, wherein a wavelength of the electromagnetic radiation is in a range from about 200 nanometers (nm) to about 3000 nm.

3. The method of claim 2, wherein the wavelength of the electromagnetic radiation is in a range from about 700 nm to about 1100 nm.

4. The method of claim 2, wherein the wavelength of the electromagnetic radiation is in a range from about 200 nm to about 400 nm.

5. The method of claim 1, wherein the first metal contact is irradiated by the electromagnetic radiation for less than about 15 seconds.

6. The method of claim 5, wherein the first metal contact is irradiated by the electromagnetic radiation for a time period in a range from about 5 seconds to about 10 seconds.

7. The method of claim 1, wherein the electromagnetic radiation is incident on a surface of the first metal contact to be contacted by the second metal contact.

8. The method of claim 1, further comprising changing a lattice of the second metal contact.

9. The method of claim 8, further comprising, prior to bonding the first metal contact to the second metal contact:
    de-oxidizing the first metal contact and the second metal contact; and
    aligning the first metal contact and the second metal contact.

10. The method of claim 1, wherein the first electronic component and the second electronic component are selected from any one of a chip, a wafer, an interposer, a substrate, a capacitor, a resistor, an indictor or a combination thereof.

11. The method of claim 1, wherein the pressure is about 10 megapascal (MPa).

12. The method of claim 1, wherein the temperature is about 250 degrees Celsius (° C.).

13. A method for manufacturing a semiconductor device, comprising:
    providing a first electronic component including a first metal contact and a second electronic component including a second metal contact, the first metal contact having a first surface and the second metal contact having a second surface;
    irradiating an electromagnetic radiation on the first surface of the first metal contact to distort a lattice at the first surface of the first metal contact; and
    bonding the first surface of the first metal contact to the second surface of the second metal contact.

14. The method of claim 13, wherein a wavelength of the electromagnetic radiation is in a range from about 700 nm to about 1100 nm.

15. The method of claim 13, wherein a wavelength of the electromagnetic radiation is in a range from about 200 nm to about 400 nm.

16. The method of claim 13, wherein the first surface of the first metal contact is irradiated by the electromagnetic radiation for less than about 15 seconds.

17. The method of claim 13, wherein the first surface of the first metal contact is irradiated by the electromagnetic radiation for a time period in a range from about 5 seconds to about 10 seconds.

18. The method of claim 13, wherein subsequent to distorting the lattice at the first surface of the first metal contact, a roughness of the first surface of the first metal contact is in a range from about 4 nm to about 6 nm.

19. The method of claim 13, further comprising, prior to bonding the first surface of the first metal contact to the second surface of the second metal contact:
    de-oxidizing the first surface of the first metal contact; and
    aligning the first surface of the first metal contact and the second surface of the second metal contact.

* * * * *